United States Patent
Thielemans et al.

(10) Patent No.: US 7,157,838 B2
(45) Date of Patent: Jan. 2, 2007

(54) LIGHT EMISSION DISPLAY ARRANGEMENTS

(75) Inventors: Robbie Thielemans, Nazareth (BE); Koen Ooghe, Langemark-Poelkapelle (BE); Steven De Keukeleire, Deinze (BE); Bruno Devos, Zulte (BE); Steve Veldeman, Brugge (BE); Tom Declerck, Meulebeke (BE); Karim Meersman, Kortemark (BE); Kristof Vanluchene, Dentergem (BE); Herbert Van Hille, Cambridge, MA (US)

(73) Assignee: Barco N.V. (BE)

( * ) Notice: Subject to any disclaimer, the term of this patent is extended or adjusted under 35 U.S.C. 154(b) by 159 days.

(21) Appl. No.: 10/681,728

(22) Filed: Oct. 8, 2003

(65) Prior Publication Data

US 2004/0135482 A1 Jul. 15, 2004

Related U.S. Application Data

(60) Provisional application No. 60/417,515, filed on Oct. 10, 2002.

(30) Foreign Application Priority Data

Nov. 10, 2002 (EP) .................................. 02079208

(51) Int. Cl.
*H01J 7/26* (2006.01)
(52) U.S. Cl. .............................. 313/35; 313/45; 313/46
(58) Field of Classification Search .................. 313/11, 313/39, 40, 44, 45, 46; 165/70; 361/687, 361/708
See application file for complete search history.

(56) References Cited

U.S. PATENT DOCUMENTS

| 4,729,076 | A | | 3/1988 | Masami et al. |
| 4,749,076 | A | | 6/1988 | Akagawa et al. |
| 5,159,529 | A | * | 10/1992 | Lovgren et al. ............ 361/699 |
| 5,390,093 | A | * | 2/1995 | Himeno et al. ............. 362/249 |
| 5,686,790 | A | * | 11/1997 | Curtin et al. ................ 313/493 |
| 5,993,027 | A | | 11/1999 | Yamamoto et al. |
| 6,154,362 | A | | 11/2000 | Takahashi et al. |
| 6,201,346 | B1 | * | 3/2001 | Kusaka ....................... 313/504 |
| 6,377,457 | B1 | * | 4/2002 | Seshan et al. .............. 361/690 |
| 6,496,370 | B1 | * | 12/2002 | Geusic et al. ................ 361/699 |
| 2001/0005308 | A1 | * | 6/2001 | Oishi et al. ................. 361/687 |
| 2003/0173891 | A1 | * | 9/2003 | Chiba et al. ................ 313/500 |

FOREIGN PATENT DOCUMENTS

| DE | 20019923 V1 | 1/2002 |
| EP | 0210274 A1 | 2/1987 |
| EP | 0559124 A1 | 9/1993 |
| EP | 1067332 A2 | 1/2001 |
| JP | 06202566 | 7/1994 |

* cited by examiner

*Primary Examiner*—Joseph Williams
*Assistant Examiner*—Matt Hodges
(74) *Attorney, Agent, or Firm*—Barnes & Thornburg LLP

(57) ABSTRACT

The present invention provides arrangements for electroluminescent displays 10 comprising a packaged semiconductor light emitting element 12 that has a light emitting display side 16. A heat sink 22 is disposed in the region of a rear side of the light-emitting element 12 opposite to the display side. Electrical connections 28 from the light emitting element 12 pass through said heat sink 22. Drive circuitry 30 for the light emitting element 12 is connected thereto by the electrical connections 28 and spaced apart from the heat sink 22 in such a manner that at least one cooling channel 34 is defined between the heat sink 22 and the drive circuitry 30 for the passage in use of a cooling fluid.

14 Claims, 10 Drawing Sheets

LIGHT EMISSION DISPLAY ARRANGEMENTS

RELATED APPLICATION

This application is the nonprovisional filing of provisional application No. 60/417,515, filed Oct. 10, 2002.

FIELD OF THE INVENTION

The present invention relates to light emission from displays, e.g. flat panel displays and in particular to methods and apparatus for cooling a flat panel display, especially a large size segmented or tiled display, e.g. an LED or OLED display. The displays are preferably suitable for display of varying digital or analog information, e.g. video films, television or camera pictures. The displays may be for use indoors or outdoors.

BACKGROUND TO THE INVENTION

It is known to provide an electroluminescent element, arranged for example in the form of a lighting unit or a display, especially as a flat panel display. Flat panel displays are described in "Display interfaces", R. L. Myers, Wiley, 2002. The electroluminescent element of a flat panel display may comprise one or more devices such as light emitting diodes (LED's), organic light emitting diodes (OLED), Liquid Crystals elements (LCD), Plasma elements (PDP), electroluminescent inorganic elements (EL-Displays), Field Emission elements (FED). If only one such device is used, or a small number of them, dissipation of heat generated during emission of light does not generally pose any great problem. Many devices of this type do not, however, produce much light individually and need to be grouped into arrays in order to be useful for many applications. The collective heat generated by such arrays may prove harmful to the devices forming the array and the ability to dissipate it will dictate the density of devices in the array and their durability. This problem is particularly acute in tiled display apparatus, which may be assembled by juxtaposition of a plurality of arrays and provide little scope for peripheral heat dissipation due to their abutting each other along their side edges. Further, electroluminescent materials used may degrade at different rates at different temperatures. For example, aging may result in lower luminosity and/or colour shifts and therefore to variations in display quality across a large display area. Where displays have to be sealed against water or dust this sealing can increase the difficulty of extracting heat.

In U.S. Pat. No. 6,161,910 an LED reading light is proposed in which an array of white LED's are provided with a tubular housing including two heat sinks. One heat sink is to the rear of the device behind an LED drive circuit and a front heat sink is interposed between the LED array and the drive circuit. The front heat sink is connected, via a thermal pad, to the rear side of the LED array. Heat generated by the LED's is transferred by conduction to the front heat sink, from where it flows radially outward to the tubular housing and then rearward to the rear heat sink. Such an arrangement concentrates heat dissipation around a periphery of the array. This makes it less than ideal for use in a tiled array, where adjoining tiles would all be dissipating heat around their abutting edges. In addition, it will be noted that at least a portion of the heat generated by the LED's must be transported from the LED heat sink to a further (i.e. rear) heat sink before being dissipated. Thus temperature gradients are probably inevitable except at low power. Also the display has a considerable thickness or depth and weight caused by the plurality of heat sinks which need to contain significant amounts of metal to be effective.

In U.S. Pat. No. 6,255,786 an LED display is disclosed for signs and proposes passive and active heat dissipation. Passive dissipation is proposed in the form of conduction from connector legs of the LED's to a solder pad of a circuit board. The whole circuit board is in turn connected to a rear-mounted heat sink via a heat pad. As the density of LED's increases, an active heat transfer device may be introduced in the form of a fan blowing onto the heat sink. Like the lamp of U.S. Pat. No. 6,161,910, at least a portion of the heat generated by the LED's in this proposal must be transported from one heat sink (the solder pad) to a further (rear) heat sink for dissipation. Thus temperature gradients will be caused. An arrangement such as the one proposed in U.S. Pat. No. 6,255,786 may prove bulky for use in a tiled array, requiring a rear mounted fan for each tile. Cooling air being blown onto the rear of the heat sink may be deflected sideways off the heat sink and interfere with the equivalent arrangement of adjacent arrays.

It is known to tile flat panel displays. Two types of tiled displays are shown schematically in FIGS. 11a and B. In FIG. 11a two tiles 90, 91 are shown of the type where connections 94–96 to the light emitting elements of the arrays are attached to the side of the panels. LCD tiled displays can be made in this manner as described in US Patent Application 2002/0080302. The side connections require a T connector 96 between the tiles in one direction which should preferably be as narrow as possible. In the other direction T-connectors 94, 95 are provided. A mask 93 obscures the unsightly connection between the two tiles 90, 91. The connectors 94,96 extend in a direction opposite to the display direction.

In FIG. 11b two tiles 97, 98 are shown of the type where connections 99,100 connected to the light emitting elements of the arrays are attached to the rear side of the panels 97, 98. LED tiled displays can be made in this manner, for example as supplied by BARCO N.V. Belgium, the Dlite 7, 10, 14 and Ilite 6, 8, 10 ranges. Back connections are much more suited to tiled displays as the mask 93 can be very much smaller. As shown in the drawing the connectors 99,100 extend in a direction opposite to the display direction.

It can therefore be seen that, in at least the art of electroluminescent displays, it is desirable to produce an arrangement that provides adequate heat dissipation and that is preferably also suitable for assembly of multiple arrays to generate tiled display arrangements.

SUMMARY OF THE INVENTION

It is an object of the present invention to provide improved addressable displays and in particular to provide improved cooling arrangements for such displays, especially tiled or segmented displays.

It is also an object of the present invention to provide improved addressable displays and in particular to provide improved cooling arrangements for such displays suitable for use where the display must be sealed, e.g. against dust or water, or out of doors where they can be subject to moisture.

It is an object of the present invention to provide improved displays and in particular to provide improved cooling arrangements for such displays, especially tiled or segmented displays.

It is also an object of the present invention to improve the compactness of displays having cooling arrangements.

Accordingly, the present invention provides a display, especially a flat panel display comprising a substrate having an array of addressable light emitting devices. A light emitting device may comprise a combination of elements which, in combination, form a light emitting device, e.g. as is found in an LCD. The array has a light emitting display side facing in a first direction. An input is provided for inputting an arbitrary image, e.g. video, data or a still image. Drive circuitry for said array of light emitting devices is provided for driving said light emitting devices to display the arbitrary image. Electrical connections are provided from said light emitting devices to the drive circuitry, said electrical connections extending from a rear side of the substrate in a second direction substantially opposed to the first direction. Said drive circuitry is spaced apart from said array in such a manner that at least one cooling channel is defined between said array and said drive circuitry for extraction of heat from said array and said drive circuitry by passage in use of a cooling fluid through the cooling channel. The cooling channel is sealed with respect to both the array of addressable light emitting devices, and with respect to the drive circuitry for said array of light emitting devices.

The cooling channel may be arranged so as to extract heat from said array and said drive circuitry in parallel.

It is understood that a flat panel display does not have to be exactly flat but includes shaped or bent panels. A tiled display may be constructed in a variety of geometrical shapes if the substrate on which the light emitting devices are to formed can be shaped in this way. A heat sink may be disposed in the region of a rear side of said array of light emitting devices opposite to said display side and forming one side of the cooling channel remote from the drive circuitry. Preferably, the heat sink abuts the rear side of the array. The electrical connections may pass through said heat sink and through the cooling channel. Said light emitting devices may comprise semiconductor light emitting elements such as Light Emitting Diodes (LED's), for example in the form of surface mounted devices (SMD). Such devices may also be field controlled devices such as are used in plasma displays or field emission displays. The light emitting devices may also be made of other materials, e.g. they may be Organic Light Emitting Diodes (OLED), EL-displays with phosphors or Liquid Crystal elements.

The array is preferably packaged when it is to be protected from dust or water or other environmental influences. For example, said light emitting array may comprise a plurality of Light Emitting Diodes (LED's) integrated into a silicon wafer and the packaging may comprise encapsulation for environmental protection. For instance, the elements may also be OLED's which are formed on a glass substrate which forms a barrier in the viewing direction. Generally the glass substrate will be sealed and therefore may be described as being part of encapsulation. Such encapsulation usually comprises, at least over a working area of said first side, a substantially transparent material. Tough, glass or shatter resistant plastic materials are preferred for the encapsulation such as polycarbonate or epoxy resin.

The heat sink may comprise a heat transporting plate having holes defined therein through which said electrical connections pass into. The connectors may pass through said cooling channel. Said heat sink may comprise a metallic material and electrical insulation may be provided between said electrical connections and said heat sink. The electrical connections may be completely insulated. The heat sink material may comprise, for example, aluminum or an alloy thereof.

Said cooling fluid may comprise a gas or may comprise a liquid. A preferred cooling fluid is a gas, especially air. A suitable liquid may comprise water. Said cooling fluid may be forced or drawn through one or more cooling channels by a fluid propulsion means. In the case of a gas cooling fluid, said fluid propulsion means may comprise a fan, blower or air pump arrangement which either blows or sucks. In the case of a liquid cooling fluid, said fluid propulsion means may comprise a pump or turbine. The cooling system may be open loop, with the cooling fluid being discarded after passage through the cooling channel. In the alternative, the cooling system may be closed loop, with the cooling fluid being recirculated. In the case of a closed loop cooling system, the cooling fluid may be cooled itself by means of a heat exchanger. In the case of gas-cooled closed loop system, a refrigerant gas may be used, such as those used in air-conditioning systems. If a liquid-cooled closed loop system is used, the cooling fluid may include a fluid other than water and may, for example, comprise distilled water with additives such as ethyl glycol, for example as anti-freeze and for corrosion inhibition.

The present invention also provides a tiled panel display formed from a plurality of display panels according to the invention, said plurality of display panels preferably being juxtaposed and configured to form a unified tiled display. The inlets and/or outlets of the cooling channels need not be linked between said plurality of display panels forming said tiled display. Each cooling channel may discharge the fluid separately, for instance. Alternatively, the cooling may be provided by forcing a cooling fluid through several or all of the display tiles, some of which are connected in series to form a cooling circuit. In some cases, e.g. if cooling is very critical, it is advantageous to only have short cooling channels. In this way, the temperature drop between the beginning and the end of the cooling channel is reduced.

A panel display or tiled panel display according to the present invention may be used as a direct view display.

The present invention also provides a method of producing a panel display, the method including:

a) providing an array of light emitting devices that has a light emitting display side facing in a first direction;

b) providing drive circuitry for said array of light emitting devices spaced apart from said array in such a manner that at least one cooling channel is defined between said array and said drive circuitry for the passage in use therethrough of a cooling fluid;

c) sealing said cooling channel from both the drive circuitry and the array; and d) connecting said drive circuitry to said array of light emitting devices by means of said electrical connections extending in a second direction substantially opposite to the first direction.

A heat sink may disposed in the region of a rear side of said array of light emitting elements opposite to said display side, the heat sink forming a side of the cooling channel remote from the drive circuitry. The method may include providing said cooling fluid in the form of at least one of a gas or a liquid and preferably forcing or drawing it through the or each cooling channel using a fluid propulsion means.

The present invention also provides a method of producing a tiled display, including juxtaposing a plurality of panel displays produced using a method according to the present invention.

The present invention also provides a method of cooling a panel display, the method including:

a) providing an array of light emitting devices that has a light emitting display side facing in a first direction;
b) providing drive circuitry for said array of light emitting devices spaced apart from said array in such a manner that at least one cooling channel is defined between said array and said drive circuitry, the cooling channel being sealed from both the drive circuitry and the array of light emitting devices;
c) electrically connecting said drive circuitry to said array of light emitting devices by means of electrical connections passing through or adjacent to said cooling channel, and
d) passing a cooling fluid through the cooling channel.

The present invention will now be described with reference to the following drawings.

BRIEF DESCRIPTION OF THE DRAWINGS

FIG. 9a shows schematic views of cooling channels of a display shown in FIG. 6a.

DETAILED DESCRIPTION OF A PREFERRED EMBODIMENT

The present invention will now be described by way of example only, with reference to certain embodiments and with reference to the above mentioned drawings. The skilled person will appreciate that many alternative arrangements are possible while still remaining within the scope of the attached claims. The invention will be described with reference to flat panel displays. It is understood that a flat panel display does not have to be exactly flat but includes shaped or bent panels. A flat panel display differs from display such as a cathode ray tube in that it comprises a matrix or array of "cells" or "pixels" each producing or controlling light over a small area. There is a relationship between the pixel of an image to be displayed and a cell of the display. Usually this is a one-to-one relationship. Each cell may be addressed and driven separately. It is not considered a limitation on the present invention whether the flat panel displays are active or passive matrix devices. The array of cells is usually in rows and columns but the present invention is not limited thereto but may include any arrangement, e.g. polar or hexagonal. The invention will mainly be described with respect to LED and OLED displays but the present invention is more widely applicable to flat panel displays of different types, such as plasma displays, filed emission displays, EL-displays, LCD's, etc. In particular the present invention relates not only to displays having an array of light emitting elements but also displays having arrays of light emitting devices, whereby each device is made up of a number of individual elements.

For a general understanding of the types and connectivity of semiconductor light emitting devices referred to herein, the reader is recommended to study: "*Semiconductor Devices: Physics and Technology*" by S. M. Sze, published by John Wiley & Sons Inc. under ISBN 0-471-33372-7.

Figure 1A:
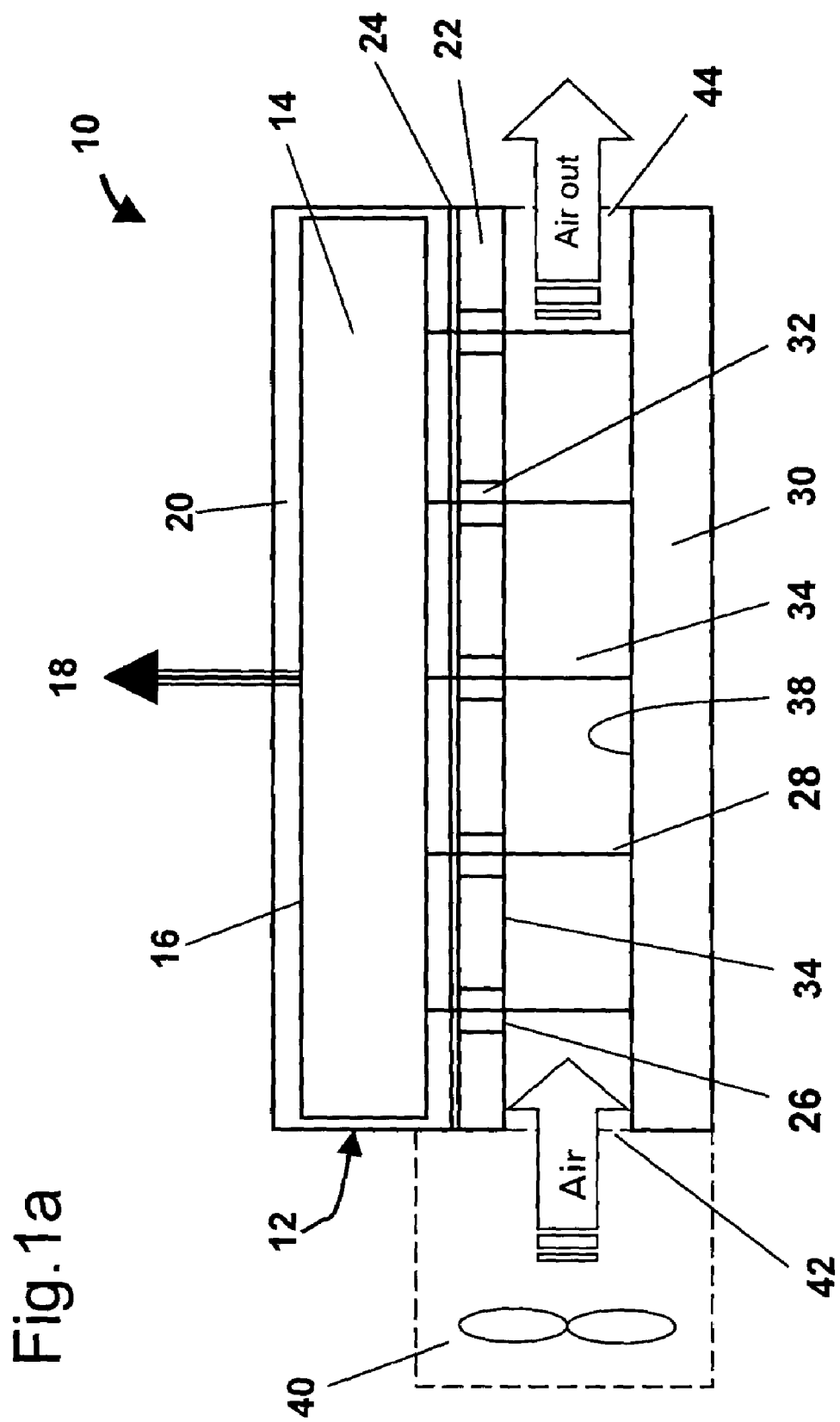
FIGS. 1a and b are schematic diagrams of a section through a flat panel display according to embodiments of the present invention.

Referring to the drawings and for the moment in particular to FIG. 1a, a flat panel display device 10 comprises a display 12 of an array 14 of light emitting devices. The light emitting devices are addressable, i.e. they can be addressed by a suitable control device to display any suitable image. The light emitting devices may comprise semiconductor elements or devices such as semiconductor light emitting diodes (LED's) or may be any other suitable light emitting devices or elements which may be arranged in an array for displaying 2D images, such as still or video images. Suitable light emitting elements are also organic light emitting diodes (OLED). The term light emitting device also includes combinations of elements which emit light and are addressable. An example of such a combination is an LCD in which a liquid crystal, one or more light polarizers, a light source and optionally coloured filters can be used to generate a light output. Light emission from the light emitting devices forming the array 14 is emitted from a display side 16 of the array 14 in a predetermined direction 18. This direction 18 is arranged such that, in use, the display 10 may be used as a direct view display, e.g. information may be read substantially directly from it by a user.

The array may require environmental protection, e.g. against dust or moisture. The array 14 may be formed from OLED's and be for use in indoors or outdoors. It is preferred to seal an OLED display environmentally. Alternatively, optical elements such as lenses may be located on the viewing side of the light emitting elements to provide certain effects, e.g. focussing the displayed light into a narrower but more intense beam with a reduced viewing angle and greater brightness. The array 14 may be formed from a series of surface mounted devices, for example deposited on a substrate or integrated into a semiconductor wafer. Such devices may require environmental protection when the display is to be used out of doors. To protect the array 14 from environmental damage or degradation it is sealed in a package, by for example encapsulation 20. This is performed in such a manner that at least a working area of the display side 16 is covered in a substantially transparent material such as polycarbonate plastic. All items placed on the viewing side of the light emitting elements may reduce the ease with which heat is removed from that side of the display.

Preferably, a heat sink 22 is provided in the form of a heat transporting plate disposed in the region of a rear side of the array 14 of light emitting devices. The heat sink 22 is preferably in thermal communication with the light emitting devices and is arranged in use to absorb heat generated thereby. The heat sink 22 may comprise a metal having a high thermal conductivity, for example, aluminum or an alloy thereof. Thermal communication may be optimized by connecting the heat sink 22 to the rear face of the light-emitting display 12 through an optional thermal pad 24. In addition the heat sink 22 may be coloured suitably to absorb heat energy, e.g. mat black to absorb radiant energy.

The heat sink 22 defines a series of holes 26 through which electrical connections 28 pass between the array 14 and associated drive circuitry 30, which comprises power and control means for the display 10. In at least the case of bare metal electrical connections 28, it is preferable for the heat sink 22 to be insulated from those connections 28 and also insulated from the rear side of the light emitting elements. Electrical insulation 32 is provided to insulate the connections 28 from the heat sink 22 and may optionally be provided to insulate the light emitting elements from the heat sink 22, e.g. in the form of an insulating layer on the rear side of the light emitting devices. The electrical insulation 32 has electrical insulating properties, but may be thermally conductive so as to conduct heat away from the electrical connections 28. The insulation 32 may, for example, comprise any suitable material and may be provided in the heat sink 22, on the electrical connections 28 or a combination of the two.

The drive circuitry 30 is spaced apart from the heat sink 22, i.e. away from the assembly comprising the light emitting devices and heat sink 22, so as to define at least one cooling channel 34 between the array 14 and the drive circuitry 30. The heat sink 22 forms at least one side of the cooling channel. An additional heat sink and heat shield (not shown) may be located adjacent the drive circuitry and facing towards the cooling channel 34. According to an aspect of the present invention, the cooling channel 34 is sealed from both the array 14 and the drive circuitry 30. The cooling channel 34 provides a passage for a cooling fluid to pass across a heat exchange face 36 of the heat sink 22 and across an upper face 38 of the drive circuitry (or additional heat sink if present). The heat exchange face 36 of the heat sink 22 (and/or the additional heat sink) may be ribbed or otherwise contoured so as to increase the surface area available for heat exchange to the cooling fluid, such profiling preferably being formed in such a manner as to promote laminar or turbulent flow. In displays having an increased LED density and in displays where the electronics are sealed off to avoid deterioration due to moisture, the heat extraction is even more difficult than for other displays. In these cases, it could be important to keep the cooling channel 34 very short, having a cooling channel 34 which goes straight through the display device 10, separating the array 14 of light emitting devices and the drive circuitry 30, as in the present invention. The cooling channel 34 should furthermore be preferably designed such that there is only cooling flow in one direction in the cooling channel 34, as illustrated in FIG. 1a, whereby the array 14 of light emitting devices is separated from the electronic layer comprising the drive circuitry 30 by the cooling flow. The latter means that the cooling flow is in contact with both the array 14 of light emitting devices and the drive circuitry 30 at the same time, avoiding worse cooling or even reheating of components by a cooling flow that has already been heated too much by first passing another component, which may be the case when drive circuitry 30 and array 14 would be serially cooled by one and the same stream of cooling fluid. Furthermore, by the parallel extraction of heat from the drive circuitry 30 and from the array 14, the covered distance of the cooling fluid may be relatively short, so that an efficient cooling may be obtained due to a relatively low pressure drop of the cooling fluid in the cooling channel 34.

The cooling channel 34 is completely sealed from the drive circuitry 30, the electrical connections 28 and the array 14 of light emitting devices. This may allow the use of a liquid as a cooling fluid. Passage of cooling fluid through the cooling channel may be open loop or closed loop. In the case of open loop cooling, the cooling fluid is discarded after passing along the cooling channel 34. In closed loop cooling, the cooling liquid is recycled, preferably being cooled between cycles by for example a heat exchanger. The cooling fluid preferably comprises a gas, such as for example air. In a basic embodiment, air-cooling may be used in open loop form with the cooling provided by convection. The advantage of this approach is that it offers the simplest and cheapest construction.

The efficiency of cooling in an open-loop or closed loop arrangement may be improved by employing a fluid propulsion means adapted to force or draw the cooling fluid through one or more of the or each cooling channels. For a gas cooling system, a fluid propulsion means may conveniently be provided in the form of a fan, blower, venturi or similar apparatus such as an air pump adapted to provide forced convention. For a liquid cooling arrangement, a fluid propulsion means may comprise a pump, turbine or equivalent.

In the case of a closed loop gas cooling arrangement, a suitable refrigerant gas may be used, such as those used in air-conditioning systems. In a closed loop liquid cooling system, a simple embodiment may employ water as a cooling fluid. It may, however, prove preferable to use a cooling fluid including a fluid or fluids other than tap water, such as for example distilled water mixed with additives such as ethyl glycol, for example as anti-freeze and for corrosion inhibition.

In the particular but non-limiting example illustrated in FIG. 1a, an open loop gas cooling arrangement is shown. A fan 40 blows air into an inlet portion 42 of the cooling channel 34 and provides forced convection such that the cooling air exits from an outlet portion 44 of the cooling channel 34 after having passed over the surfaces 34, 38 of the heat sink 22 and drive circuitry 30.

Figure 1B:
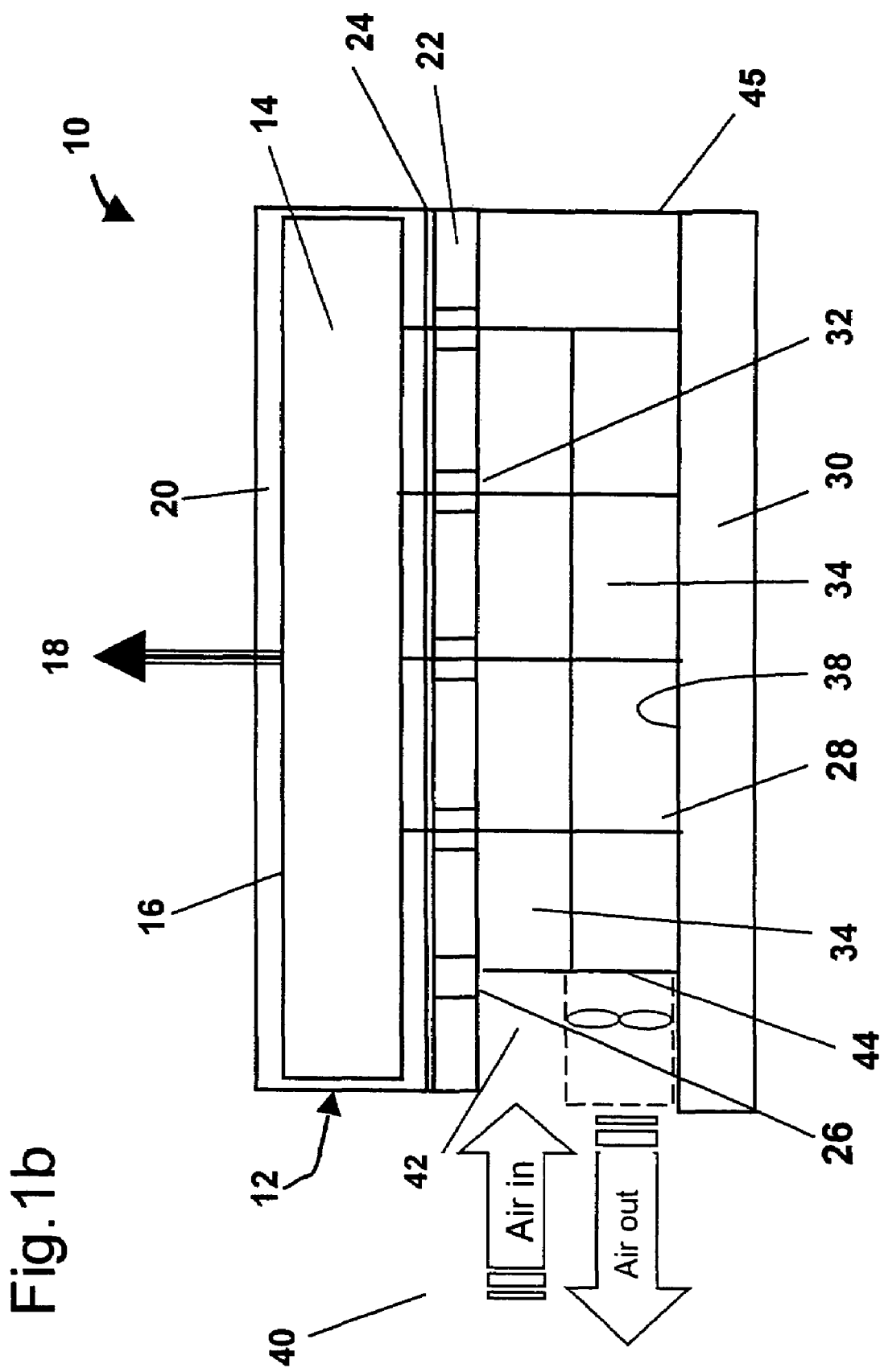

FIG. 1b shows an alternative open loop gas cooling arrangement. The reference numbers in FIG. 1b refer to the same items as in FIG. 1a and only the differences with respect to FIG. 1a will be mentioned. The fan 40 sucks air into the inlet portion 42 of the cooling channel 34 and provides forced convection such that the cooling air exits from the outlet portion 44 of the cooling channel 34 after having passed over the surfaces 34, 38 of the heat sink 22 and drive circuitry 30. In this arrangement a partition is provided in the middle of the cooling channel which directs the air flow to first cool the heat sink 22 and then to cool the drive circuitry 30. In an alternative arrangement the fan may blow air into the cooling channel 34 in which case the drive circuitry is cooled first followed by the heat sink 22. A barrier 45 is provided at the opposite end of the cooling channel 34 to reverse the air flow.

In order to provide large displays and/or displays that can be configured for diverse outputs, the present invention is adapted for juxtaposition of display units 10 to form tiled displays. In order to make such tiled displays appear as if they are one-piece, the gap between neighbouring displays is preferably kept to a minimum.

Figure 2A:
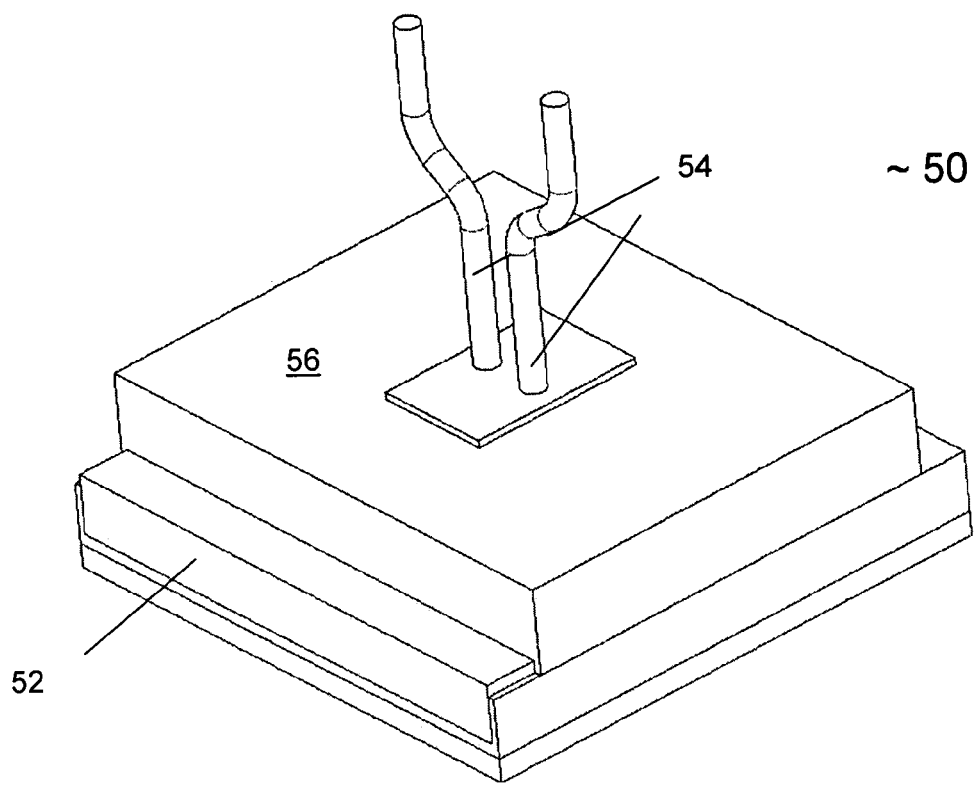
FIGS. 2a and b show a rear view and a front view, respectively of a display tile in accordance with an embodiment of the present invention.
Figure 2B:
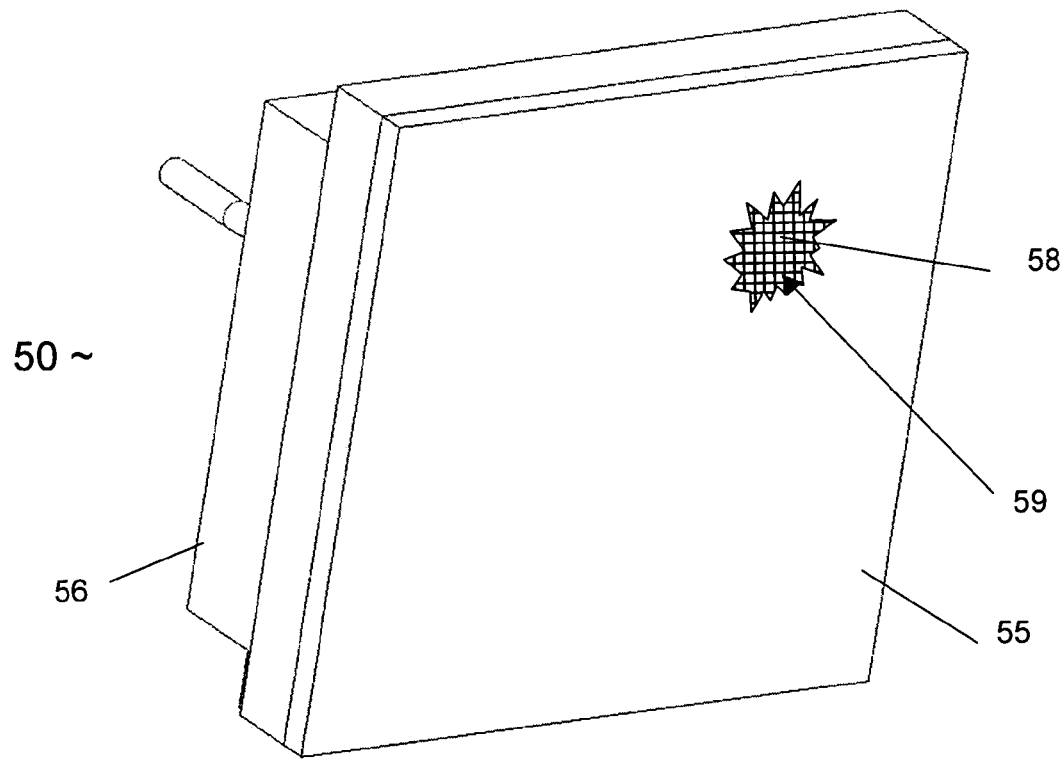

A single tile 50 of such an array being an embodiment of the present invention will be described with reference to FIGS. 2 to 11. FIGS. 2a and b show the reverse side and the display side of a tile 50, respectively. On the reverse side, connectors 54 are mounted on a door 56 which can house a power supply. Connectors can be provided for a variety of functions, e.g. for power input, for control purposes and for input of an image signal. With respect to the latter, the display according to the present invention has an input for image signals which are to be displayed by the addressable light emitting elements in the display. For various protocols such as VESA GTF, CIF, VGA, NTSC, CCIR-601, SMPTE, SXGA, HDTV, Wide XGA, Ultra XGA, etc. which may be used with the present invention reference is made to standards works such as "Display Interfaces", R. L. Myers, Wiley, 2002

Figure 3:
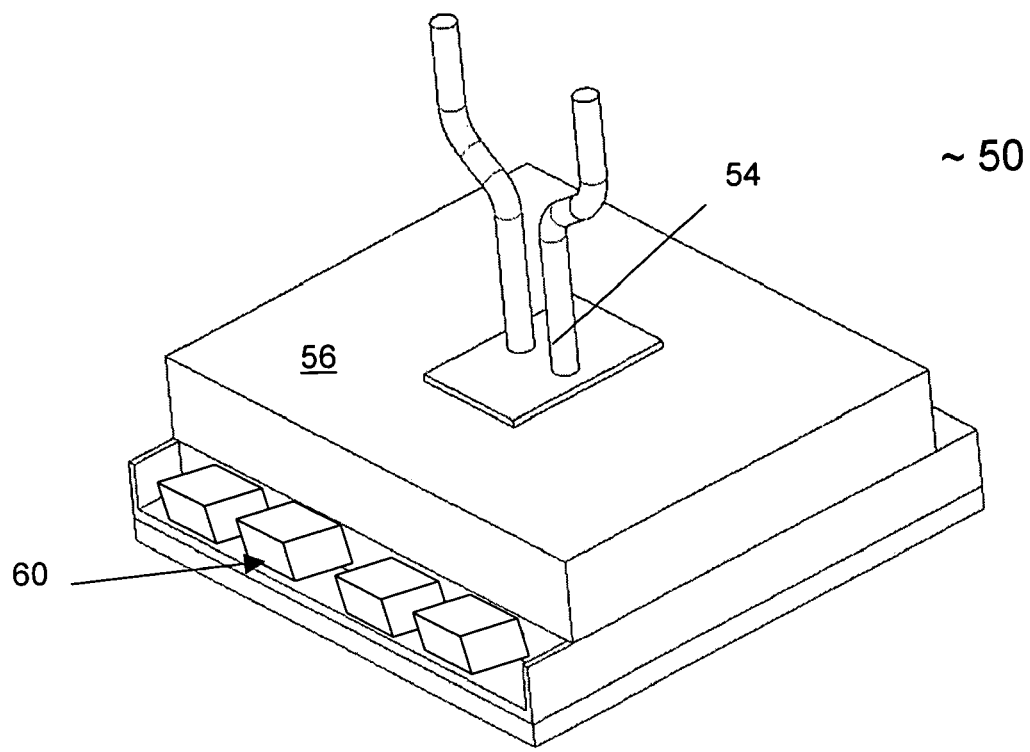
FIG. 3 is the rear view of FIG. 2a with the fan assembly cover plate removed.
Figure 4:
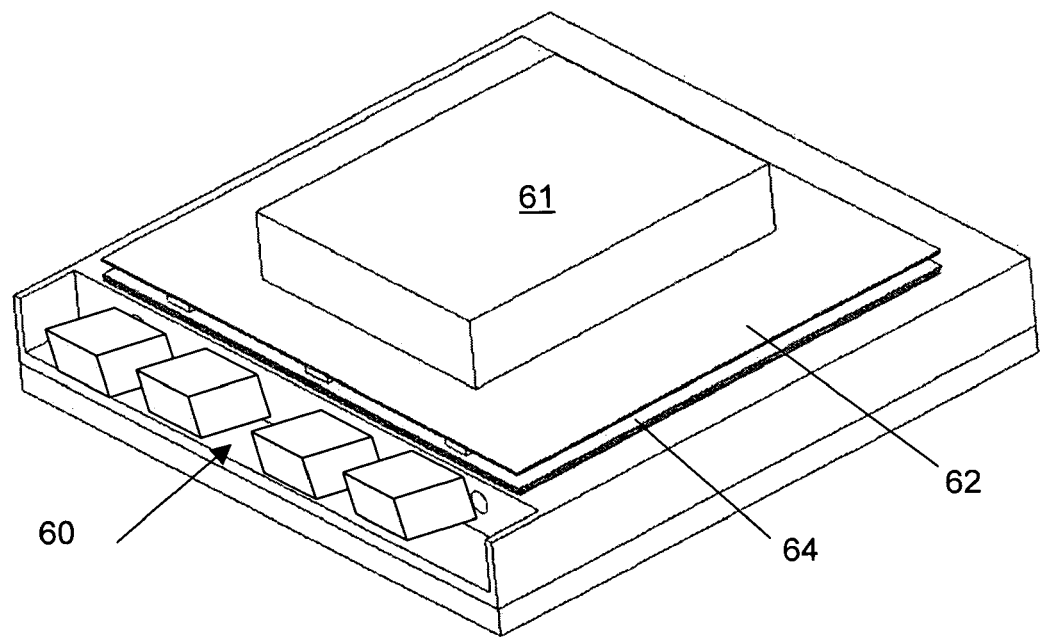
FIG. 4 shows the view of FIG. 3 with the door removed.
Figure 5:
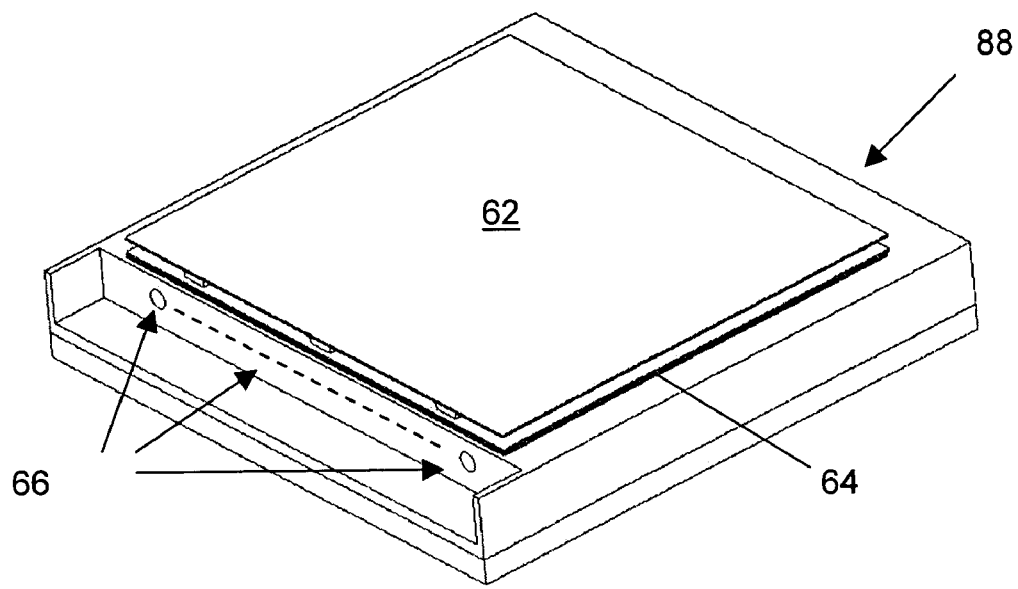
FIG. 5 shows the view of FIG. 4 with the controller removed.
Figure 6A:
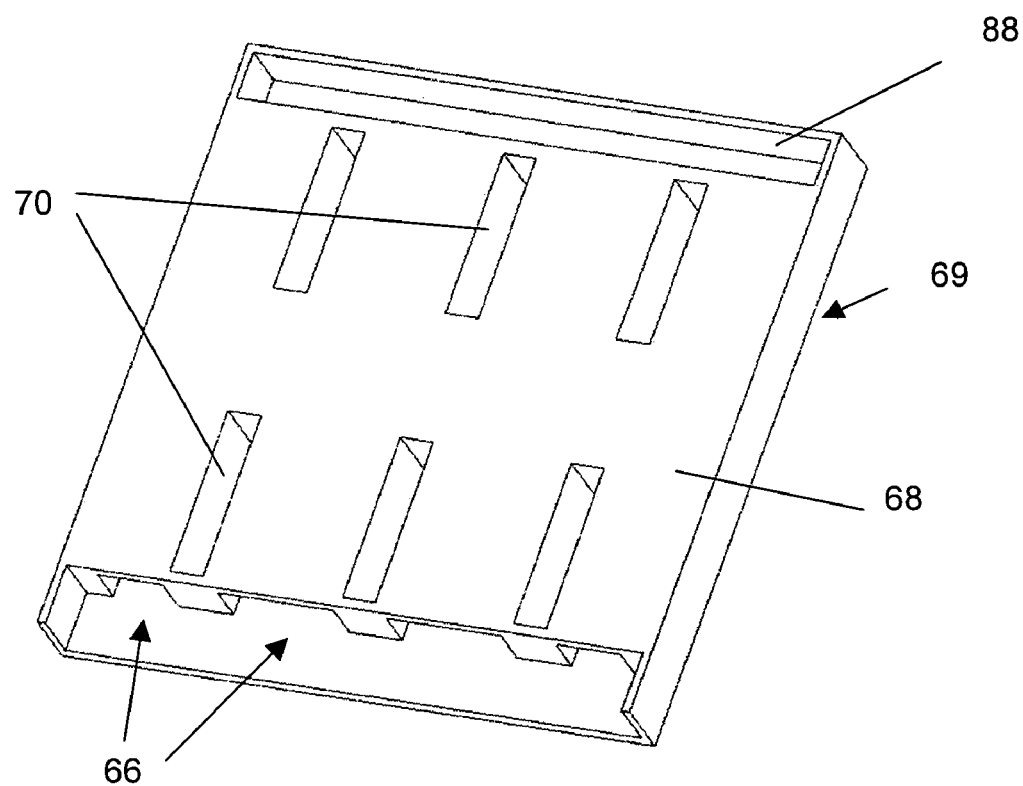
FIGS. 6a and 6b show the view of FIG. 5 with the drivers removed for two embodiments of the present invention.
Figure 6B:
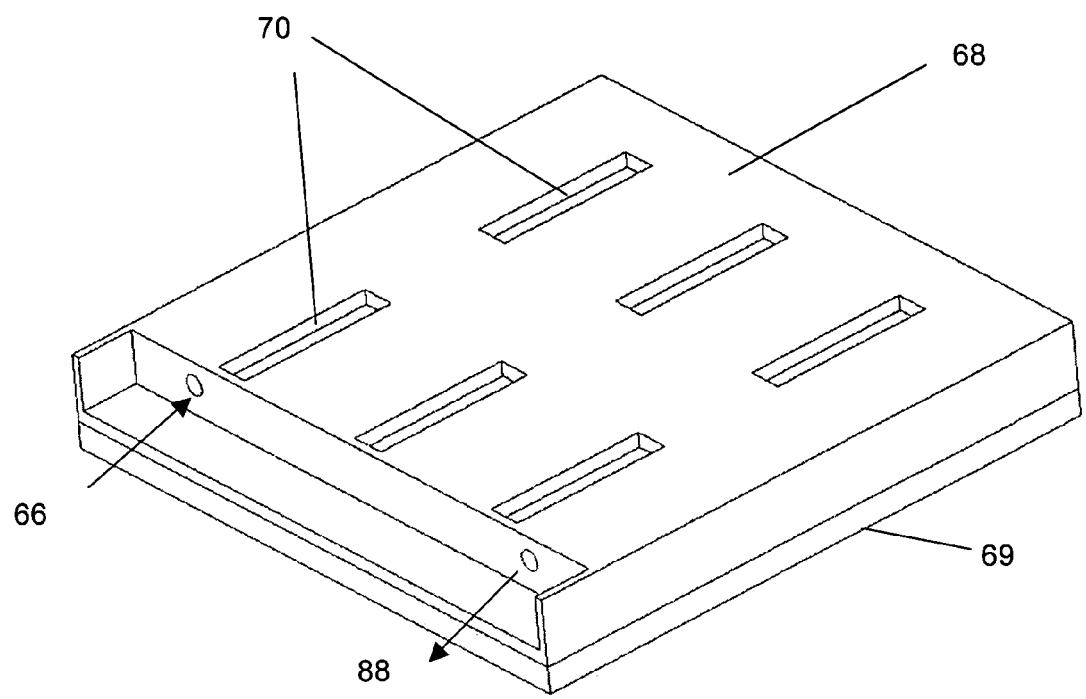
Figure 9A:
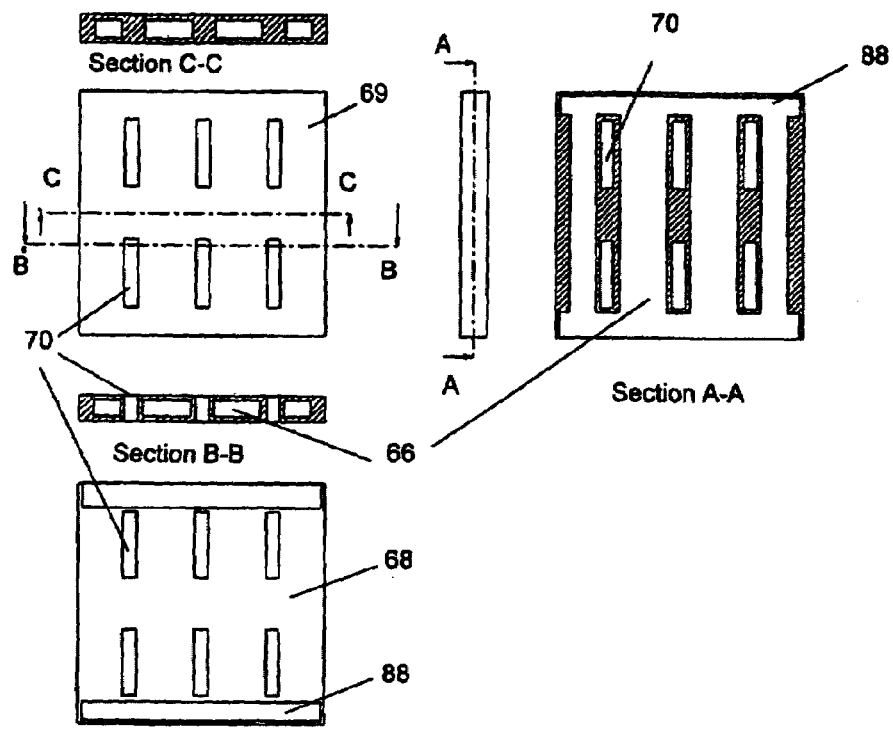
Figure 9B:
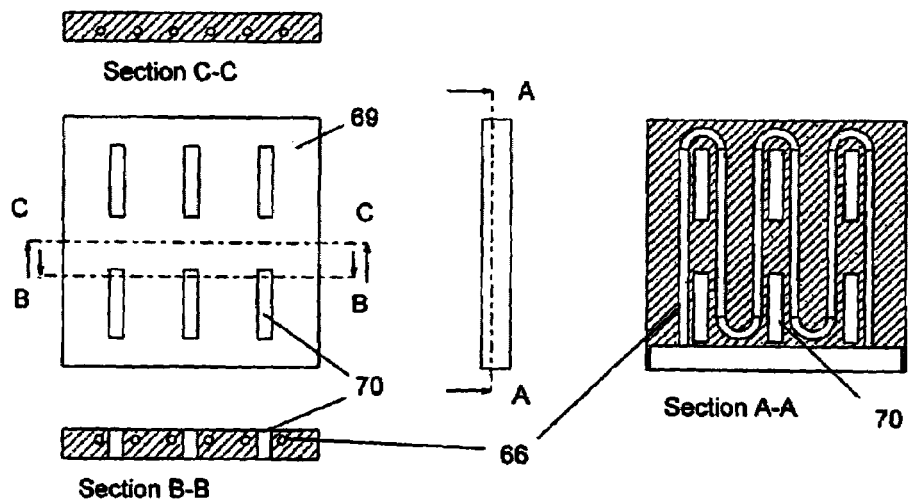
FIG. 9b shows schematic views of cooling channels of a display shown in FIG. 6b.

A plate 52 covers a fluid propulsion unit for generating a convective cooling flow in cooling channels, e.g. one or more fans when the fluid is a gas, e.g. air. The display side comprises a cover sheet 55 underneath which a plurality of display devices 58 are provided in the form of an array 59, e.g. the light emitting devices may be LED's or OLED's. FIG. 3 shows the reverse side of the tile 50 of FIG. 2 with the cover plate 52 removed thereby exposing a fluid propulsion assembly such as a fan assembly having a number of fans 60. The cover plate 52 covers the fans 60 and provides an air inlet. The fans may be impregnated to have an IP54 rating. FIG. 4 shows the reverse side of FIG. 3 with the door 56 and power supply removed. A power supply 61 is thereby exposed. FIG. 5 shows the view of FIG. 4 with the fan assembly 60 and the power supply 61 removed. A controller 62 and a driver assembly 64 with one or more drivers are then exposed. The drivers are able to drive a plurality of light emitting elements 58 of a display 59 so as to display an arbitrary still image, an arbitrary data image or an arbitrary video image or similar. Where the fans have been removed the entrance of one or more cooling channels 66 can be seen. The exit 88 for the cooling channels 66 can be located on the opposite side of the tile 50. The fluid outlet 88 of one tile 50 may be connected to the fluid inlet 66 of the next tile when assembled. FIGS. 6a and b both show cooling assemblies being the view of FIG. 5 with the drivers 64 removed for two different embodiments. A plate 68 is visible for mounting the drivers 64 and the controller 62. The plate 68 may be made of a heat conducting material, e.g. aluminium and may act as a heat sink on the controller/driver side of the cooling channel 66. On the opposite side a similar plate 69 is mounted. Holes 70 are provided for receiving connectors from the drivers to the array of light emitting devices 58. In FIG. 6a, the cooling channels 66 run underneath the plate 68 and exit at 88. These cooling channels are shown in more detail in FIG. 9a. Also shown in FIG. 9a are the connector holes 70 for receiving the connectors which connect the drivers 64 to the array 59. The connectors when mounted preferably pass through the cooling fluid in the cooling channels and are therefore cooled optimally. The exiting cooling fluid such as air may be released to the atmosphere via 88 or conveyed to another part of the display system, e.g. to the fluid input of the next tile or to an air cooling unit from which it returns to the input of a tile. In FIG. 6b an alternative cooling arrangement is shown in which the cooling channels are arranged in a labyrinth/serpentine between plate 69 and plate 68, e.g. a series of meanders over the full width of plate 68 and exit from the input side through one of the channels 66 as shown in FIG. 9b. Note that in this case the connectors 86 are received in holes 70 and are located adjacent to the cooling channels. An alternative for meandering the cooling channels 66 over the full width of plate 68 may be meandering back and forward from left to right, referenced to FIG. 9b section A—A, instead of meandering back and forward from top to bottom. The inlets and outlets of the cooling channels 66 are on the same side of the tile. This is advantageous for side mounted connectors, e.g. for LCD displays, where access for cooling may be limited by the connector positions. In all cases the cooling channels 66 are preferably arranged over the area of the light emitting devices 58 so as to provide uniform cooling of all elements of the display array 59.

Figure 7:
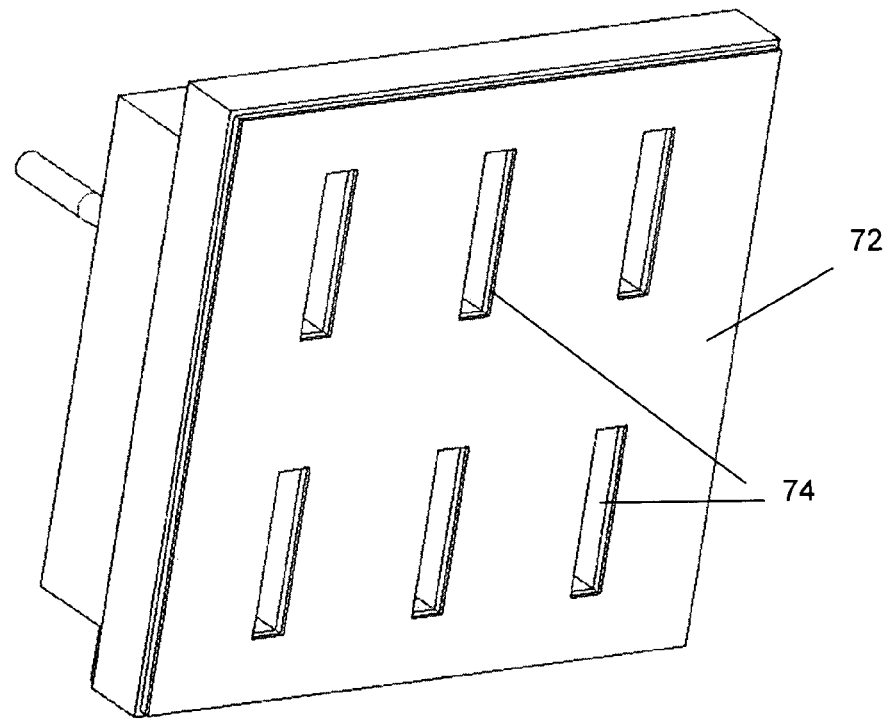
FIG. 7 shows the front of the plate onto which the light emitting devices are mounted.
Figure 8:
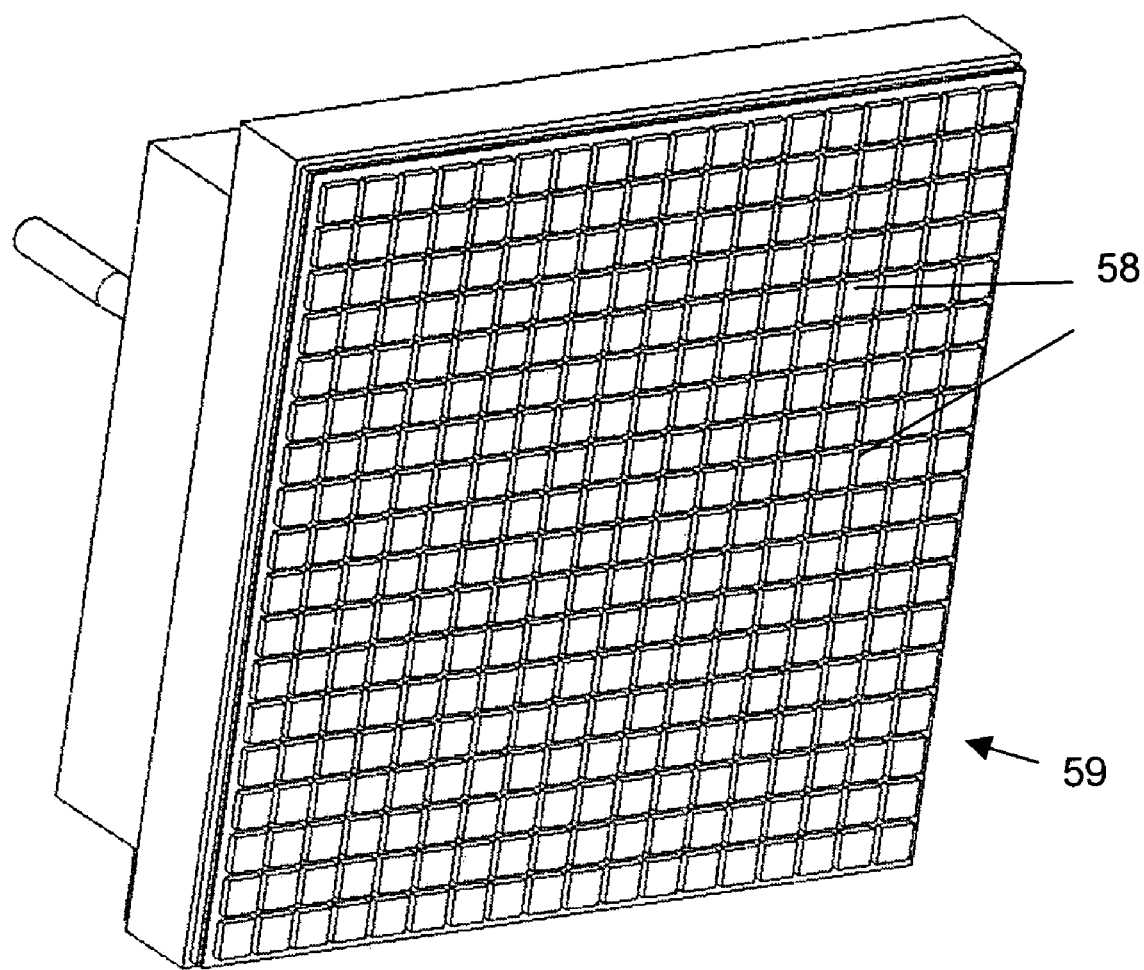
FIG. 8 shows a front view of the display panel without a cover plate.

FIG. 7 shows the front side of the display to which the display array 59 is attached. It shows one or more heat sinks 72 which are made of a heat conducting material, especially a metal such as aluminium. Holes 74 are provided which line up with the holes 70 shown in FIG. 6 when assembled so that connectors can pass through these holes 70, 74 from the drivers to the display elements 58. The display array 59 (as shown in FIG. 8) is attached to this plate to form a display unit. A cover sheet 55 may be applied to protect the display 59 (see FIG. 2b).

Figure 10:
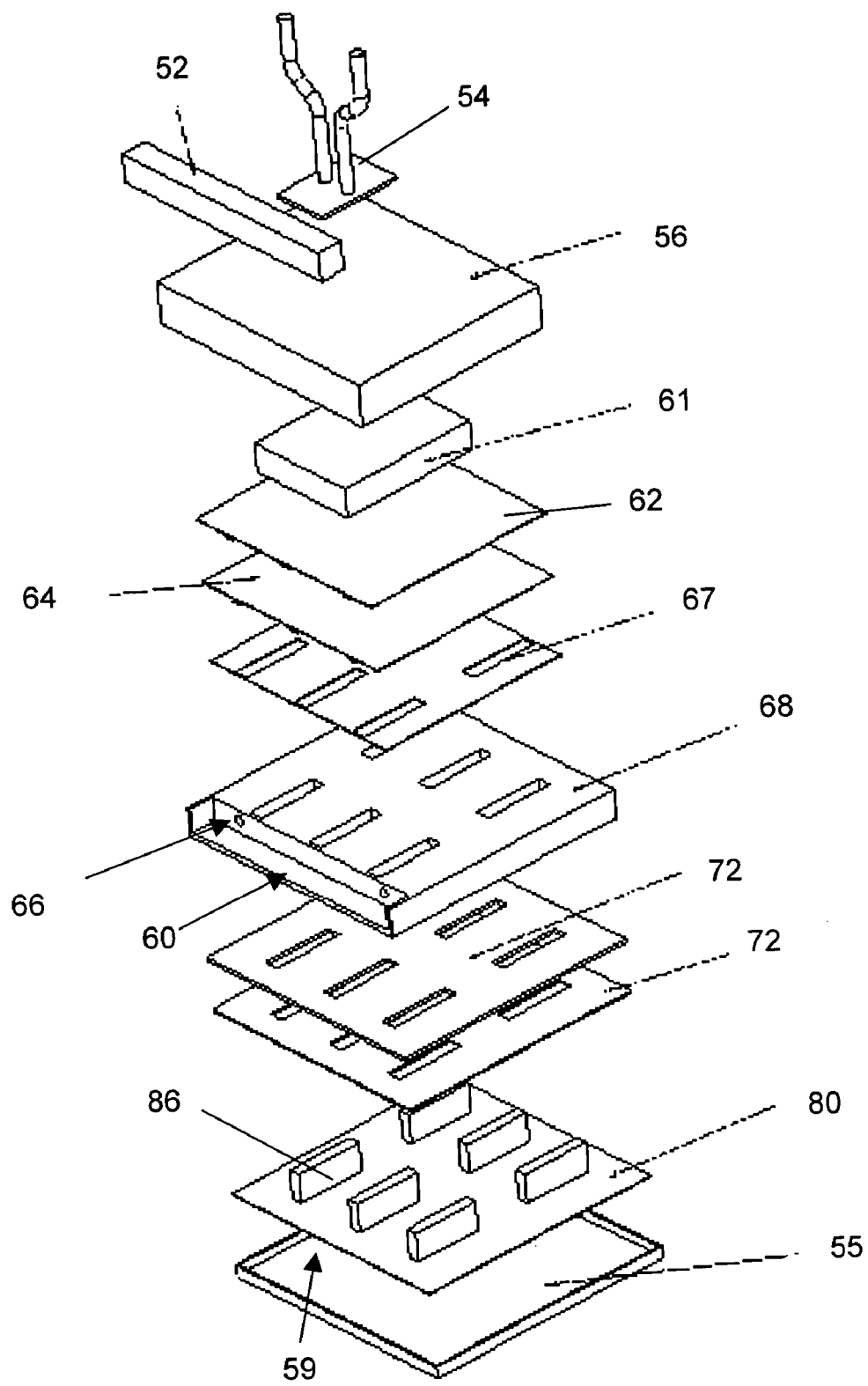
FIG. 10 shows an exploded view of a display panel in accordance with the present invention.
Figure 11A:
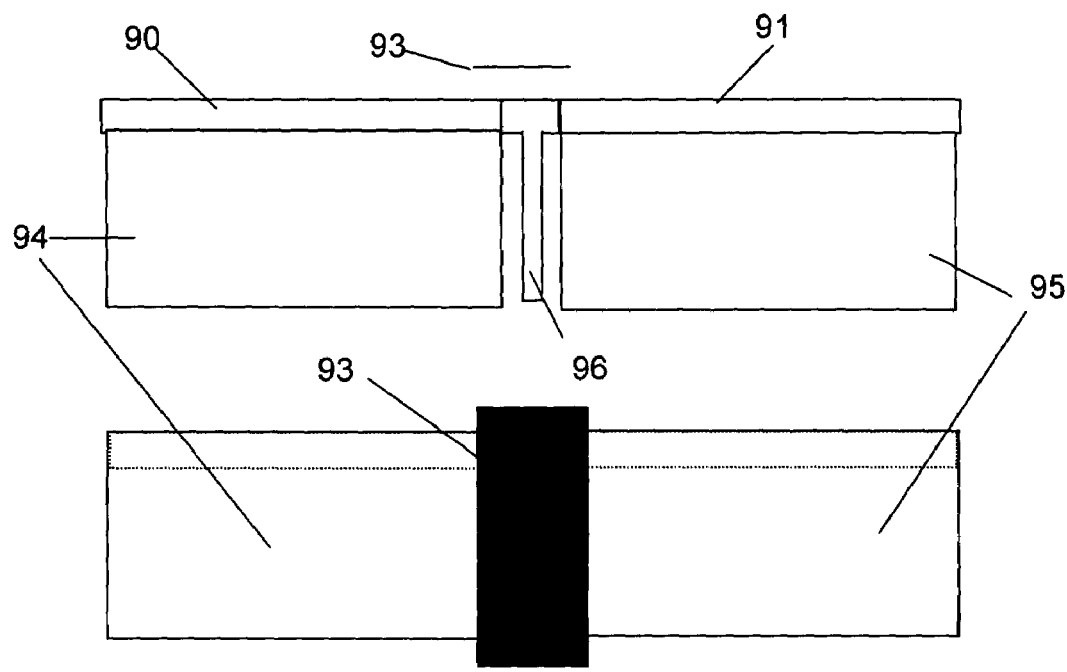
FIG. 11a is a schematic representation of a prior art LCD tiled display.
Figure 11B:
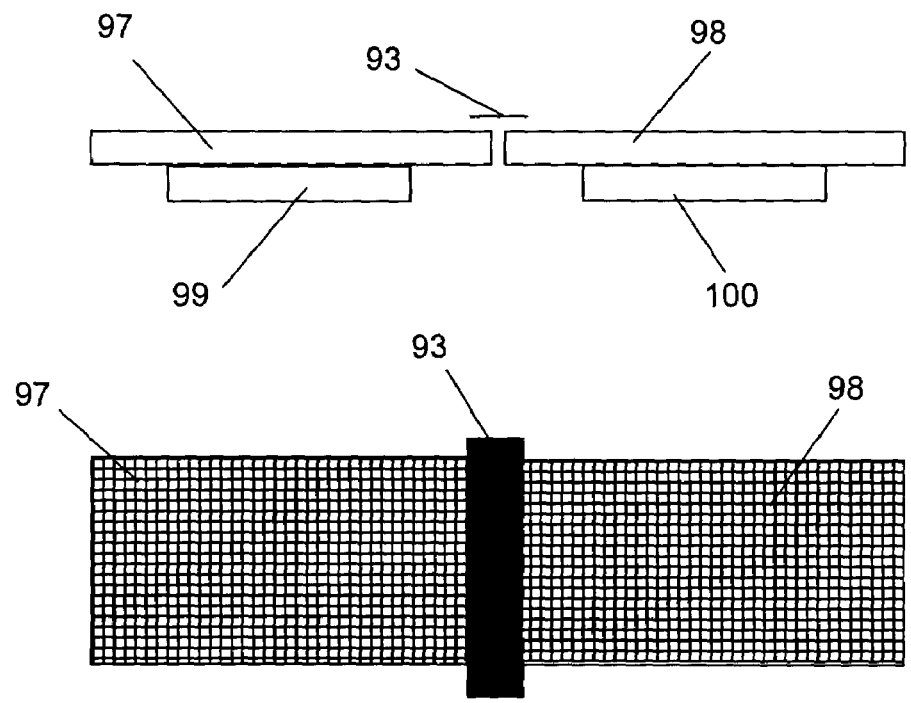
FIG. 11b is a schematic representation of a prior art LED tiled display.

The various plates of the display device are connected together using suitable studs and bolts and may be sealed with suitable gaskets in a packaged manner so that the display is environmentally protected. FIG. 10 shows an exploded view through the assembled device. From bottom to top: a transparent protection sheet 55 is secured to the board 80 on which an array 59 of light emitting devices 58 are located. The light emitting devices 58 of the display array 59 are connected with one or more connectors 86 to the driver board(s) 64 through holes in the one or more plates (heat sinks) 72 and plate(s) 67, 68 (heat sink). The connectors 86 extend from the rear side of the array 59 in a direction parallel to the main viewing direction, i.e. opposite to the display direction. The drivers 64 are connected to the controller 62. The controller 62 and the other devices are powered by a power supply 61 located on the door 56. The plate 52 covers the region of the forced cooling equipment 60 (e.g. fans) which force cooling fluid into the cooling channels 66. It can be seen in this arrangement that sources of heat such as a power supply, a controller, the drivers for the light emitting devices are all arranged on one side of the cooling channels, namely the side remote from the viewing surface of the display, whereas the light emitting devices themselves are located on the other side of the cooling channels. Thus the heat sources are separated from the sensitive light emitting elements by the cooling channels.

It can therefore be seen that an arrangement according to the present invention provides improved cooling for flat panel displays, in particular for those that include packaged light emitting devices. The heat sink draws heat substantially directly off the light emitting devices forming the array and there is little danger of mutual heating between the cooling surfaces of the display and its drive circuitry. In addition, precise conduits may be formed for the coolant fluid, which lends itself to more precise control of overall heat exchange. The electrical connections benefit from direct cooling from the cooling fluid along at least a portion of their length. In particular the connectors are cooled close to their connection to the light emitting devices of the array so that heat transferred along the metal conductive pathways in the connectors can be removed before it reaches the light emitting elements. Also the present invention lends itself to tiled displays having minimal gaps between constituent parts whilst providing efficient cooling sufficient to allow use of light emitting devices of the surface-mount variety and/or devices integrated into a silicon wafer. In the above mentioned embodiments, the cooling at those places where the fans 60 are mounted differs from the cooling at places where the cooling channels 66 are present. This can have negative effects as there can be a difference in cooling ability at one of these places. In alternative embodiments, not represented in the drawings, and having the same features as the above embodiments, this problem may be avoided by placing an inlet of the cooling channel 66, and consequently also the fan(s) 60, at the back of the flat panel display device 10, instead of at the side of the flat panel display device 10, whereby the cooling channel 66 is immediately led between the array 14 of light emitting devices and the drive circuitry 30 to allow parallel cooling of both parts, i.e. without cooling e.g. the drive circuitry 30 first. In this way, cooling of the array 14 of light emitting devices and the drive circuitry 30 occurs in parallel, i.e. simultaneously. In the same way the exit 88 of the cooling channel 66 can be directed to the back of the display device 10, thereby providing a connection that is as short as possible between the part of the cooling channel 34 witch runs substantially parallel to the array 16 and the back of the display device 10. The latter is preferred to avoid large cooling channels 34 with inherent pressure drops and inefficient cooling, as well as unnecessary heating of the components, e.g. by passing already heated cooling fluid over other elements to be cooled.

The cooling channel 34, running substantially parallel to the light emitting part and the electronics part, can be present along the whole display, with a single inlet and outlet to the back. In other embodiments, different inlets and outlets can be used, all positioned at the back side of the display, but all installed such that no real cooling takes place prior to the channel being in between the array part and the electronics part, the cooling fluid thus being provided so as to perform cooling of both parts simultaneously. While the present invention has been particularly shown and described with respect to a preferred embodiment, it will be understood by those skilled in the art that changes in form and detail may be made without departing from the scope and spirit of the invention.

The invention claimed is:

1. A panel display comprising:
    a) a substrate having an array of addressable light emitting devices, the array having a light emitting display side facing in a first direction;
    b) an input means for inputting an arbitrary image;
    c) drive circuitry for said array of light emitting devices for driving said light emitting devices to display the arbitrary image;
    d) electrical connections from said light emitting devices to the drive circuitry, said electrical connections extending from a rear side of the substrate in a second direction opposed to the first direction;
    e) a heat sink comprising a heat transporting plate having a plurality of holes defined therein through which said electrical connnections pass;
    f) said drive circuitry being spaced apart from said array in such a manner that at least one cooling channel is defined between said array and said drive circuitry for extraction of heat from said array and said drive circuitry by passage of a cooling fluid through the cooling channel,
    g) said heat sink being disposed in the region of the rear side of said array of light emitting devices opposite to said display side, and
    h) wherein the cooling channel is sealed with respect to both the array of addressable light emitting devices, and with respect to the drive circuitry for said array of light emitting devices.

2. A panel display according to claim 1, wherein the cooling channel is arranged so as to extract heat from said array and said drive circuitry in parallel.

3. A panel display according to claim 1, wherein the panel is flat or curved.

4. A display according to claim 1, wherein the heat sink is disposed within or adjacent said at least one cooling channel.

5. A display according to claim 1, wherein said light emitting devices comprise semiconductor light emitting devices.

6. A display according to claim 5, wherein said light emitting devices comprise a plurality of Light Emitting Diodes (LED's) or organic light emitting devices (OLED's).

7. A display according to claim 1, wherein said light emitting devices are packaged for environmental protection.

8. A display according to claim 7, wherein said encapsulation comprises, at least over a working area of the display side, a substantially transparent material.

9. A display according to claim 1, wherein said heat sink comprises a metallic material and electrical insulation is provided between said electrical connections and said heat sink.

10. A display according to claim 1, wherein said cooling fluid comprises a gas or a liquid.

11. A display according to claim 1, wherein said cooling fluid is forced or drawn through one or more cooling channels by a fluid propulsion means.

12. A tiled display formed from a plurality of flat panel displays according to claim 1, said plurality of displays preferably being juxtaposed and configured to form a unified said tiled display.

13. A tiled display according to claim 12, wherein said cooling channels are separated between said plurality of displays forming said tiled display.

14. A tiled display according to claim 12, wherein the cooling channels of a plurality of flat panel displays forming the tile display are connected together to form a cooling circuit.

* * * * *